United States Patent
Reynolds

(10) Patent No.: US 7,546,109 B2
(45) Date of Patent: Jun. 9, 2009

(54) GILBERT MIXERS WITH IMPROVED ISOLATION AND METHODS THEREFOR

(75) Inventor: Scott K. Reynolds, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 11/174,360

(22) Filed: Jun. 30, 2005

(65) Prior Publication Data

US 2007/0004367 A1      Jan. 4, 2007

(51) Int. Cl.
*H04B 1/10* (2006.01)
*H04B 1/26* (2006.01)

(52) U.S. Cl. .................. 455/323; 455/313; 455/302; 455/285

(58) Field of Classification Search ............ 455/323, 455/252.1, 333, 313, 326, 293, 209, 302, 455/285; 327/355–357; 375/316, 319
See application file for complete search history.

(56) References Cited

U.S. PATENT DOCUMENTS

| | | | | |
|---|---|---|---|---|
| 5,884,154 A | * | 3/1999 | Sano et al. | 455/321 |
| 6,057,714 A | * | 5/2000 | Andrys et al. | 327/105 |
| 6,597,899 B2 | * | 7/2003 | Souetinov et al. | 455/323 |
| 6,774,699 B1 | * | 8/2004 | Lin | 327/355 |
| 6,972,625 B2 | * | 12/2005 | Nguyen et al. | 330/254 |
| 7,016,664 B2 | * | 3/2006 | Souetinov | 455/323 |
| 7,161,406 B1 | * | 1/2007 | Ferris | 327/359 |
| 7,177,620 B1 | * | 2/2007 | Tsai et al. | 455/333 |
| 2007/0004367 A1 | | 1/2007 | Reynolds | |

OTHER PUBLICATIONS

Barrie Gilbert, "The Micromixer: A Highly Linear Variant of the Gilbert Mixer Using a Bisymmetric Class-AB Input Stage", IEEE Journal of Solid-State Circuits, vol. 32, No. 9, Sep. 1997.
Barrie Gilbert, "A Precise Four-Quadrant Multiplier with Subnanosecond Response", IEEE Journal of Solid-State Circuits, vol. SC-3, No. 4, Dec. 1968.

* cited by examiner

*Primary Examiner*—Sonny Trinh
(74) *Attorney, Agent, or Firm*—Ference & Associates LLC

(57) ABSTRACT

The employment of cascoding in connection with improving mixer isolation in a Gilbert mixer circuit is provided. In this vein, there is broadly contemplated herein, inter alia, the provision of a mixer suitable for use in a direct-conversion radio receiver operating in the 57-64 GHz industrial, scientific, and medical (ISM) band. Such a receiver may be integrated along with a transmitter entirely on a silicon integrated circuit and can be used to receive and transmit data signals in such applications as wireless personal-area networks (WPANs). Numerous other applications, of course, are available for a mixer with improved LO-to-RF isolation, particularly at millimeter-wave frequencies where high LO-to-RF isolation is difficult to achieve.

12 Claims, 5 Drawing Sheets

-- PRIOR ART --

GILBERT MIXERS WITH IMPROVED ISOLATION AND METHODS THEREFOR

FIELD OF THE INVENTION

The present invention relates generally to mixers used in radio receivers and transmitters, and more specifically to methods for improving isolation between the signal paths for a local oscillator (LO) and a radio frequency (RF) input or output signal.

BACKGROUND OF THE INVENTION

Herebelow, numerals in square brackets—[ ]—are keyed to the list of references found towards the close of the present disclosure.

In the general realm of direct-conversion radio receivers operating at high frequencies, it is well known that leakage of the local-oscillator (LO) signal into the RF-signal path can generate cross-modulation and inter-modulation distortion and time-varying DC offsets in the mixer stage of the receiver. Since the LO signal and the RF signal are at the same frequency, the LO signal which leaks into the RF-signal path is indistinguishable from the RF signal itself, and the LO leakage is mixed with the LO signal itself in the mixer to appear as a distortion or noise component in the mixer's baseband output.

Accordingly, it has been found to be desirable to minimize the leakage of the LO signal into the RF-signal path. Conventionally, this has been done at least in part by laying out the circuits so as to minimize the coupling between the LO and RF signal paths. In the mixer itself, double-balanced mixers are preferred [1,2] since they provide generally good isolation between the LO port and the RF-input port.

However, at sufficiently high frequencies, LO-to-RF isolation of even a double-balanced mixer can become inadequate. Inherent imbalances in the circuit due to imperfect component matching results in incomplete cancellation of the LO fundamental at the common emitters of the switching quad, and leakage of the LO fundamental frequency to the RF input occurs through the base-collector junction capacitance of the RF-input transistors.

Accordingly, a need has been recognized in connection with improving upon the shortcomings and disadvantages experienced with conventional arrangements as discussed above.

SUMMARY OF THE INVENTION

There is broadly contemplated herein, in accordance with at least one presently preferred embodiment of the present invention, the employment of cascoding in connection with improving mixer isolation in a Gilbert mixer circuit.

In this vein, there is broadly contemplated herein, inter alia, the provision of a mixer suitable for use in a direct-conversion radio receiver operating in the 57-64 GHz industrial, scientific, and medical (ISM) band. Such a receiver may be integrated along with a transmitter entirely on a silicon integrated circuit and can be used to receive and transmit data signals in such applications as wireless personal-area networks (WPANs). Numerous other applications, of course, are available for a mixer with improved LO-to-RF isolation, particularly at millimeter-wave frequencies where high LO-to-RF isolation is difficult to achieve.

As a further notable advantage in connection with at least one embodiment of the present invention, by employing internal cascoding between the switching quad and the transconductance stage, feedback through the base-collector junction of the RF-input transistors can be significantly reduced.

In summary, one aspect of the invention provides a Gilbert mixer circuit comprising at least one cascode element for improving mixer isolation.

Another aspect of the invention provides a method of improving mixer isolation in a Gilbert mixer, the method comprising the step of providing at least one cascode element for improving mixer isolation.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
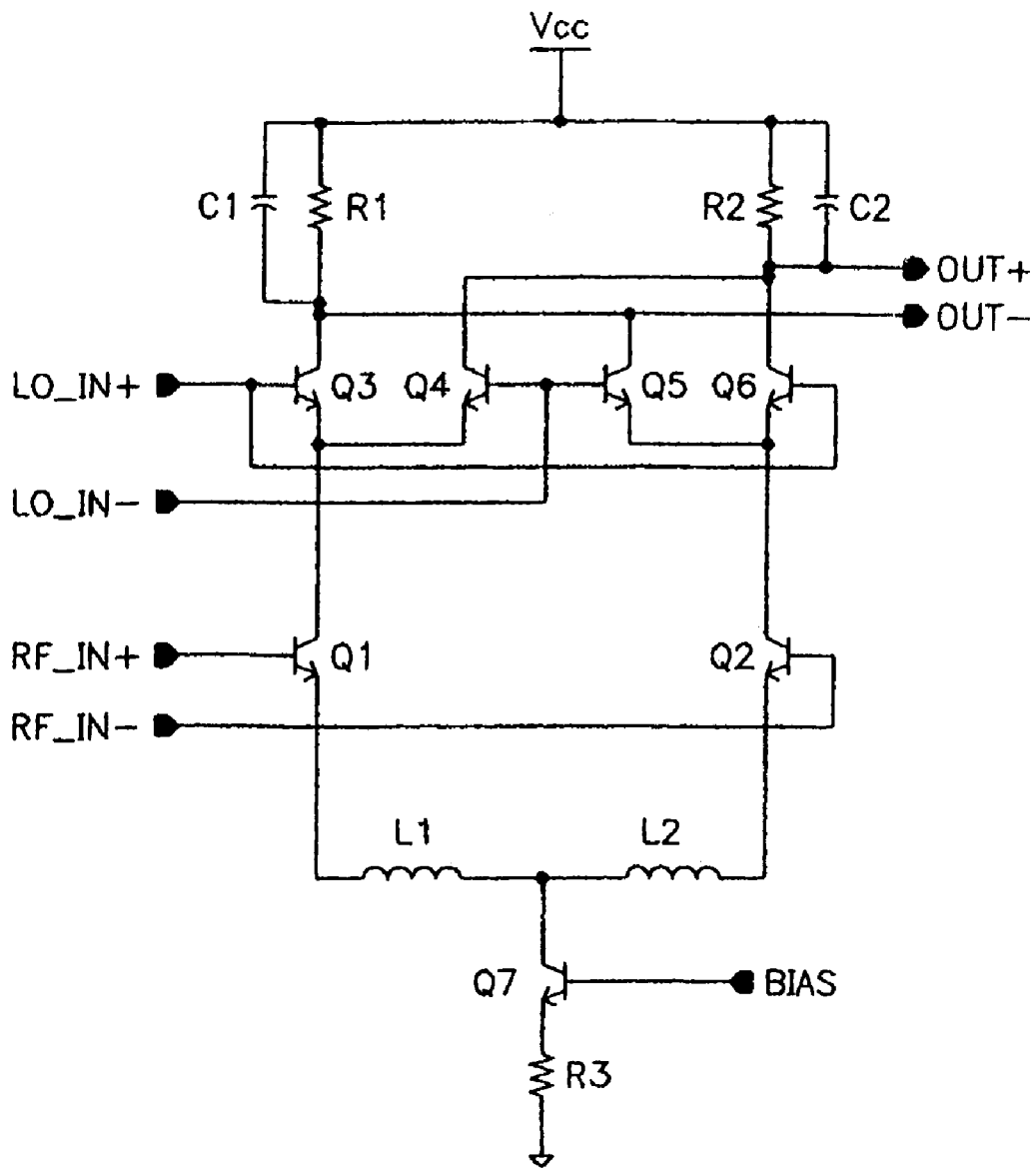
FIG. 1 schematically depicts a conventional Gilbert mixer circuit.

FIG. 1 illustrates a conventional double-balanced Gilbert mixer [1-2]. The LO signal is applied to the bases of the switching quad (Q3-Q6). The LO signal which appears at the two common emitters of the switching quad (that is, the common emitter of Q3 and Q4, and the common emitter of Q5 and Q6) is primarily the second harmonic of the LO frequency. However, due to imperfect matching of Q3 and Q4 (and Q5-Q6), some fundamental frequency LO signal does appear at these nodes. The fundamental frequency LO signal can then leak back to the RF input by way of the base-collector capacitance of Q1 and Q2.

In connection with a mixer such as that shown in FIG. 1, at most frequencies, the circuit balance is good, so there is little fundamental LO signal at the common emitters of the switching quad. In addition, the leakage across the base-collector capacitors is small, so the LO-to-RF isolation obtained from the double-balanced Gilbert mixer is excellent. However, it has been found that at 60 GHz (and other millimeter-wave frequencies), circuit balance is not as good, because the transistors must be made small and biased at high current densities, and therefore will not match as well as larger transistors biased at lower current densities. In addition, significant leakage can occur across even small base-collector capacitances, because the frequencies are so high. Consequently, LO-to-RF leakage through this circuit can become significant at 60 GHz.

Figure 2:
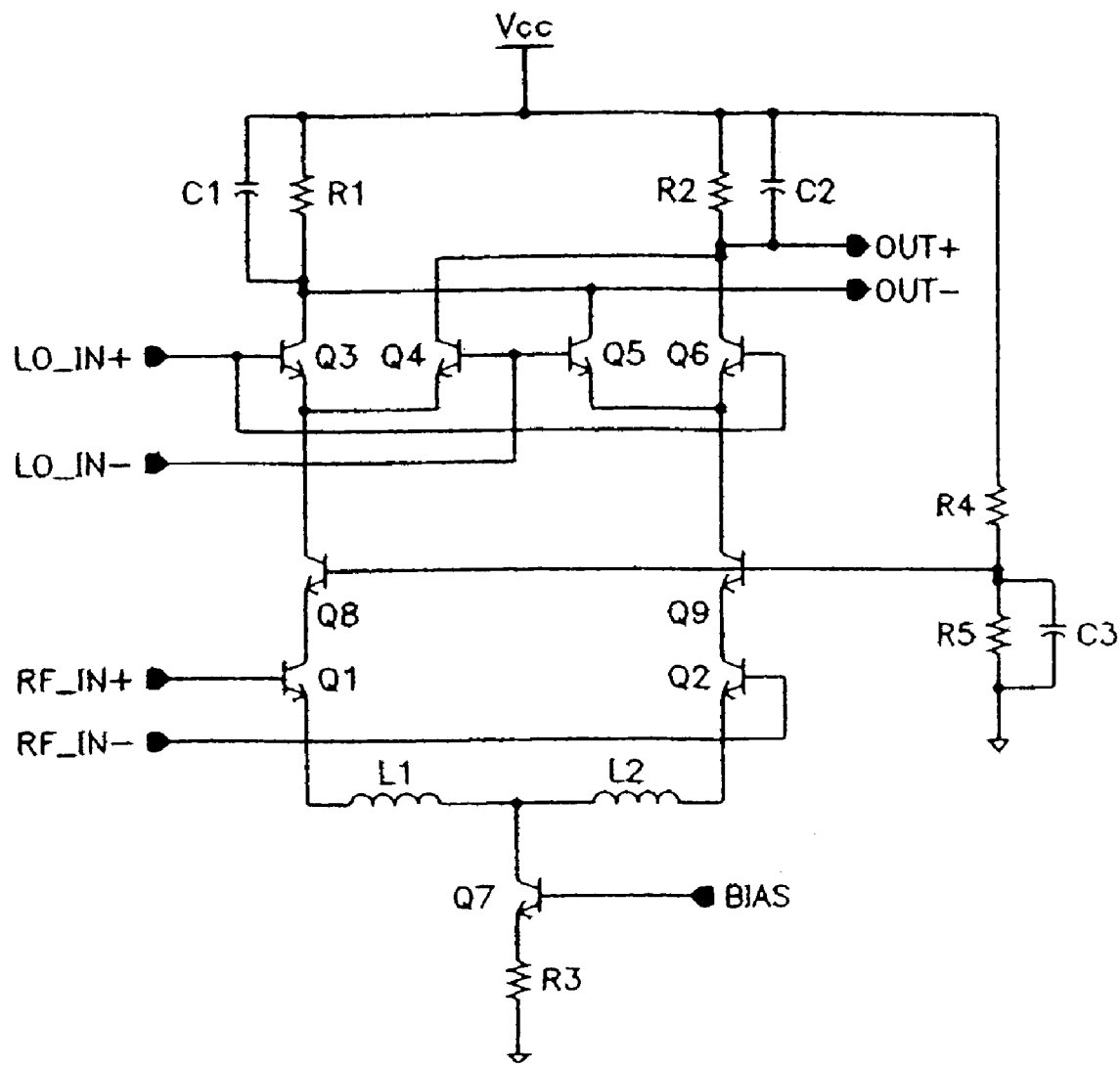
FIG. 2 schematically depicts a mixer circuit, in accordance with a preferred embodiment of the present invention, which includes cascode transistors.

In accordance with a preferred embodiment of the present invention, and with reference to FIG. 2, the leakage of the LO fundamental frequency through the base-collector capacitances can preferably be reduced by the addition of cascode transistors Q8 and Q9. Indeed, cascoding is a well known technique for reducing the feedback across the base-collector capacitance of a transistor, often used to improve the performance of an amplifier at high frequencies. However, it is not known that such a technique has been used for improving mixer isolation.

Figure 3:
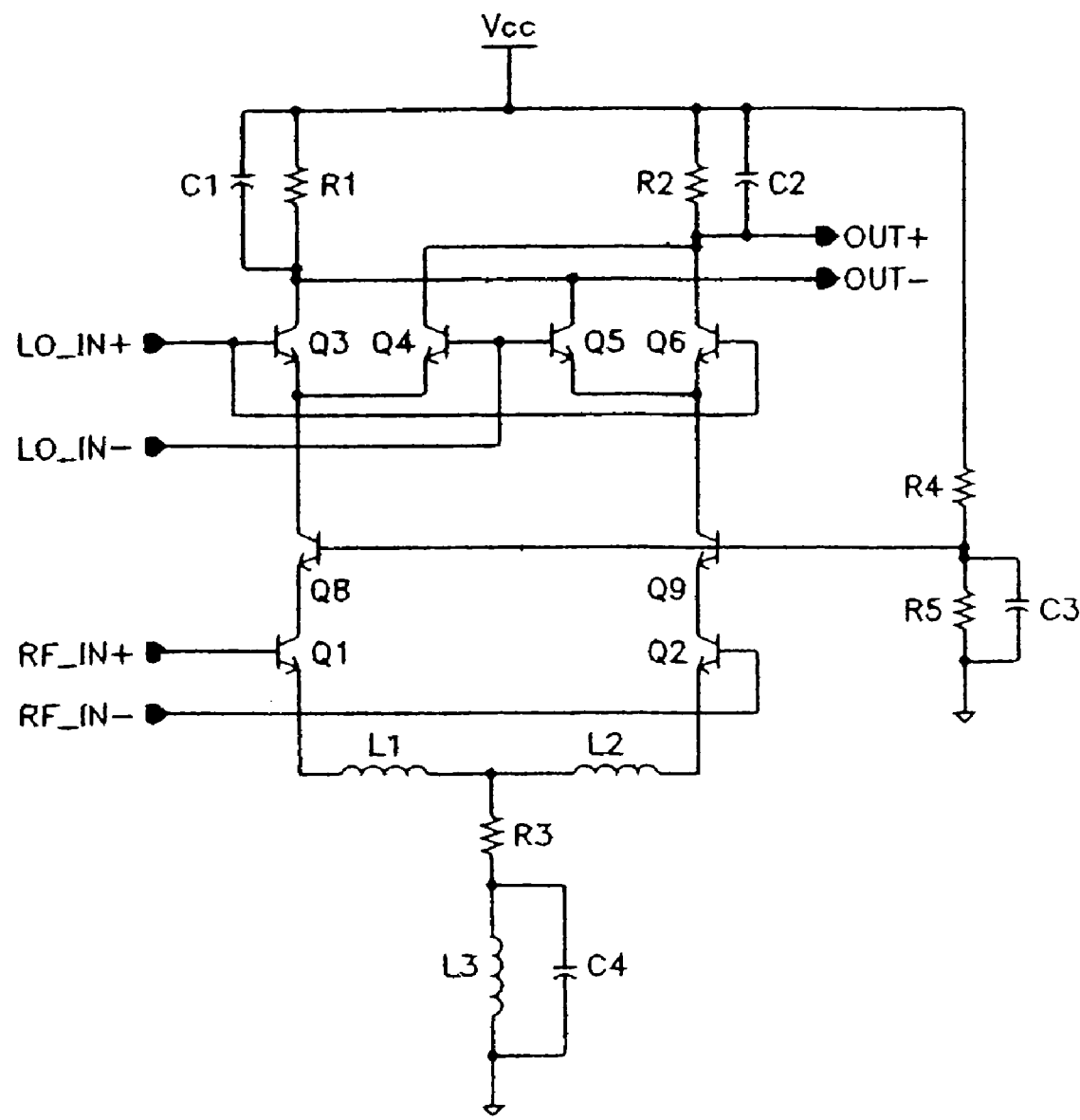
FIG. 3 schematically depicts a circuit similar to that in FIG. 2, but with the inclusion of a parallel resonant LC circuit.

Although Q8 and Q9 in FIG. 2 significantly improve LO-to-RF isolation, the additional transistor in the stack can reduce the voltage headroom in the circuit. Accordingly, in accordance with a preferred embodiment of the present invention, this can be remedied by removing the constant-current source transistor Q7 in FIG. 2 and replacing it with a parallel resonant LC circuit, as shown in FIG. 3. This results in the circuit having a high effective AC impedance at the frequency of interest (in this case, 60 GHz), but without the DC voltage drop associated with an active constant-current source.

Figure 4:
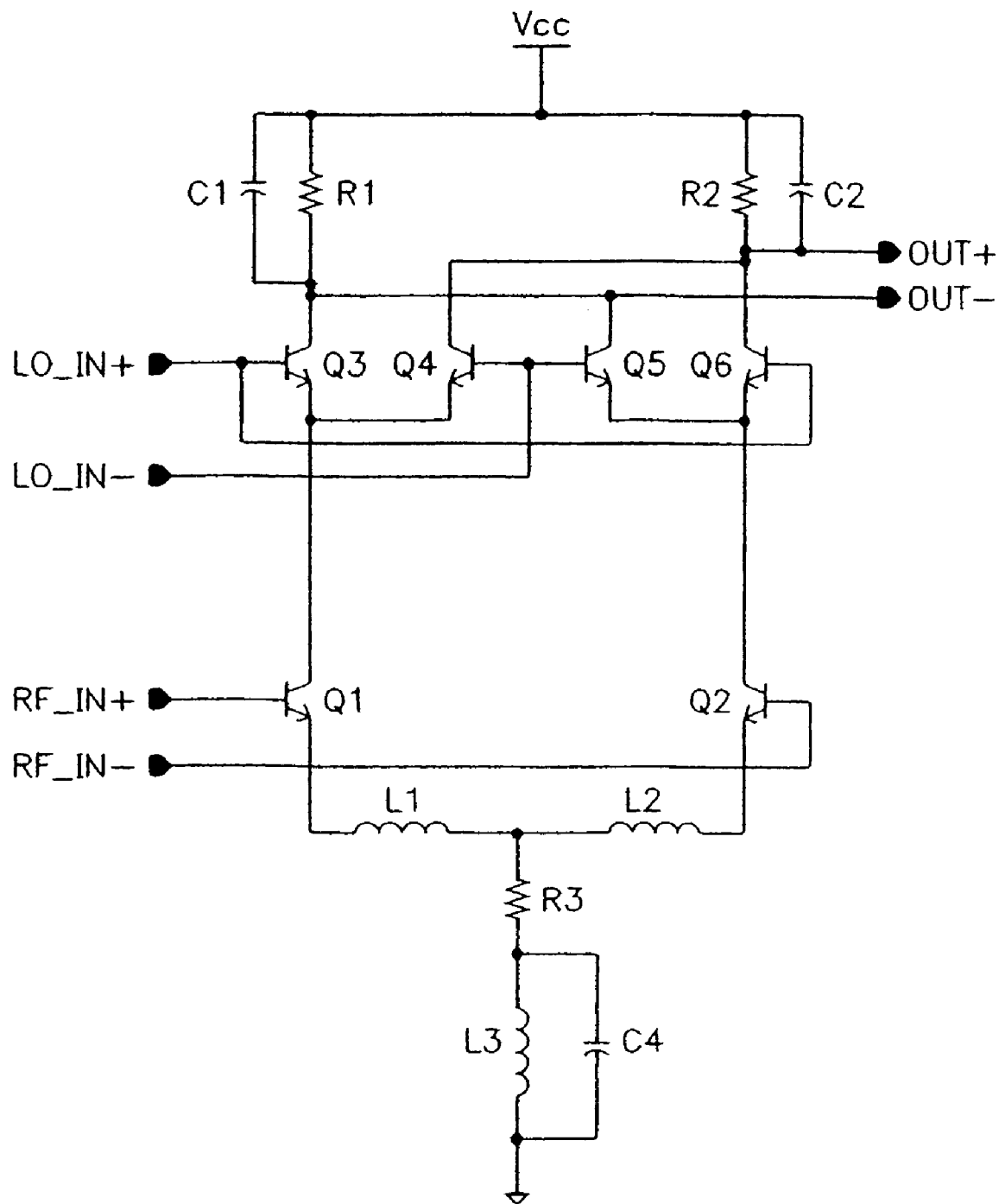
FIG. 4 schematically depicts a circuit similar to that in FIG. 3, but (for the purpose of experimentation) without cascode transistors.
Figure 5:
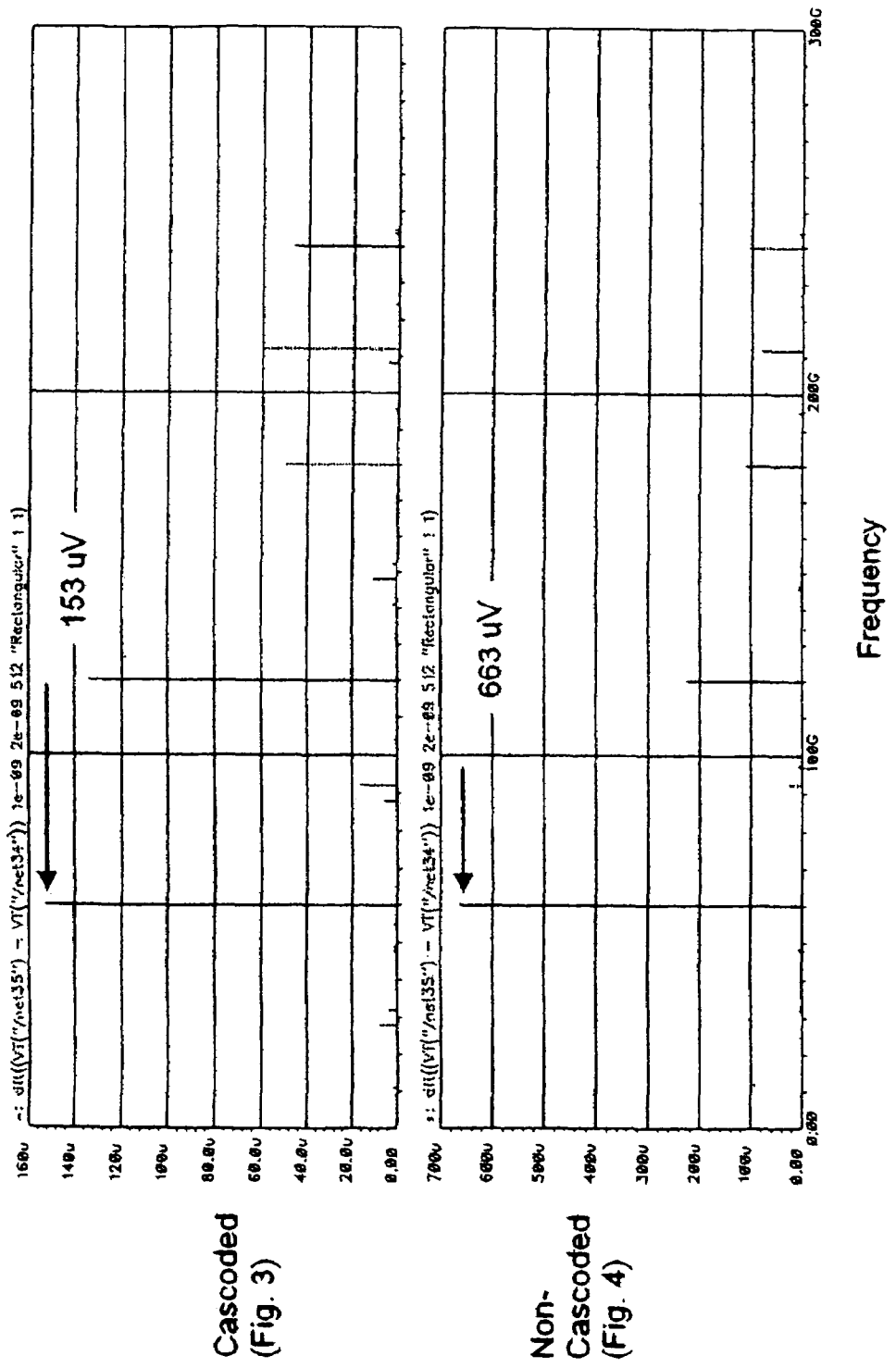
FIG. 5 conveys results of a circuit simulation comparing cascoded and non-cascoded mixers.

By way of experimentation, circuit simulations were run to quantify the amount of improvement in LO-to-RF isolation that occurs with the addition of the cascode transistors; results of the simulations are shown in FIG. 5. Accordingly, the circuit in FIG. 3 was simulated both with (FIG. 3) and without (FIG. 4) cascode transistors Q8 and Q9. The switching transistors Q3-6 were imbalanced by increasing the emitter area of Q3 by 20% (from 2×0.12 μm² to 2.4×0.12 μm²) to model the imperfect transistor matching that occurs when small-area devices are biased at high current densities. Such a circuit imbalance increases the LO-to-RF leakage at the fundamental frequency of 60 GHz because of the imperfect cancellation of the fundamental at the common emitters of Q3-4 and Q5-6. In simulation, then, the addition of Q8 and Q9 reduced the leakage of a 60 GHz LO signal to the RF input from 663 μV to 153 μV, or by 12.7 dB.

Overall, although many variations on a Gilbert mixer have been presented heretofore [3-8], nothing on the order of the arrangements presented in FIGS. 2 & 3 is known to have been hitherto realized. While the use of a cascode device in the input stage of a Gilbert mixer is shown in FIG. 12 of Gilbert [10], it is used solely for the improved biasing of an unusual class-AB input stage, which is completely different from the embodiments of the present invention (e.g. as illustratively and non-restrictively exemplified in FIGS. 2 & 3).

Generally, it is broadly contemplated that circuits in accordance with at least one embodiment of the present invention be realized in a Silicon-Germanium BiCMOS process (IBM BiCMOS8HP), as was done in the simulation mentioned heretofore. However, it should be appreciated and understood that circuits could alternatively be implemented in any of a wide variety of other processes, such as in a silicon CMOS process, or in various III-V semiconductor processes, such as GaAs.

If not otherwise stated herein, it is to be assumed that all patents, patent applications, patent publications and other publications (including web-based publications) mentioned and cited herein are hereby fully incorporated by reference herein as if set forth in their entirely herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

REFERENCES

1. U.S. Pat. No. 3,241,078
2. U.S. Pat. No. 3,689,752
3. U.S. Pat. No. 4,322,688
4. U.S. Pat. No. 5,311,086
5. U.S. Pat. No. 5,589,791
6. U.S. Pat. No. 6,054,889
7. U.S. Pat. No. 6,140,849
8. U.S. Pat. No. 6,348,830
9. B. Gilbert, "A Precise Four-Quadrant Multiplier with Subnanosecond Response", IEEE JSSC, vol. SC-3, no. 4, pp. 365-373, December 1968.
10. B. Gilbert, "The Micromixer: A Highly Linear Variant of the Gilbert Mixer Using a Bisymmetric Class-AB Input Stage", IEEE JSSC, vol. 32, no. 9, pp. 1412-1423, September 1997.

What is claimed is:

1. A Gilbert mixer circuit comprising:
at least one cascode element for improving mixer isolation;
a transconductor portion; and
a switching portion;
said at least one cascode element being generally connected between said transconductor portion and said switching portion;
wherein said switching portion comprises a switching quad;
wherein said switching quad comprises a first common emitter and a second common emitter;
wherein said first common emitter and said second common emitter each comprise a LO signal input;
wherein said at least one cascode element comprises a pair of cascode transistors;
wherein said circuit further comprises a pair of RF signal inputs; and
wherein said pair of cascode transistors is respectively connected between one of said LO signal inputs and one of said RF signal inputs, whereby LO-to-RF isolation is improved.

2. The circuit according to claim 1, wherein said pair of cascode transistors comprise bipolar transistors.

3. The circuit according to claim 1, wherein said pair of cascode transistors comprise MOSFETs, MESFETs, or HEMTs.

4. A method of improving mixer isolation in a Gilbert mixer, said method comprising:
providing at least one cascode element for improving mixer isolation;
providing a transconductor portion;
providing a switching portion;
generally connecting the at least one cascode element between the transconductor portion and the switching portion; and
providing a pair of RF signal inputs;
wherein said step of providing a switching portion comprises providing a switching quad;
wherein said step of providing a switching quad comprises providing a first common emitter and a second common emitter;
wherein said step of providing a first common emitter and a second common emitter comprises providing respective LO signal inputs;
wherein said step of providing at least one cascode element comprises providing a pair of cascode transistors; and
wherein said step of providing a pair of cascode transistors comprises respectively connecting each of the cascode transistors between one of the respective LO signal inputs and one of the RF signal inputs, whereby LO-to-RF isolation is improved.

5. The method according to claim 4, wherein said step of providing a transconductor portion comprises configuring the transconductor portion to employ resistive degeneration for increasing linear input signal range.

6. The method according to claim 4, further comprising the step of providing a parallel resonant LC circuit which provides biasing.

7. The method according to claim 4, wherein said step or providing a pair of cascode transistors comprise providing bipolar transistors.

8. The method according to claim 7, wherein said step of providing a transconductor portion comprises configuring the transconductor portion to employ inductive degeneration for increasing linear input signal range.

9. The method according to claim 7, wherein said step of providing a transconductor portion comprises configuring the transconductor portion to employ resistive degeneration for increasing linear input signal range.

10. The method according to claim 7, further comprising the step of providing a parallel resonant LC circuit which provides biasing.

11. The method according to claim 7, wherein said step or providing a pair of cascade transistors comprise providing bipolar transistors.

12. The method according to claim 7, wherein said step of providing a pair of cascade transistors comprises providing MOSFETs, MESFETs, or HLMTs.

* * * * *